US012777577B2

(12) United States Patent
Wang

(10) Patent No.: US 12,777,577 B2
(45) Date of Patent: Oct. 27, 2026

(54) CIRCUIT BOARD, METHOD FOR MANUFACTURING THE SAME AND TERMINAL DEVICE HAVING THE SAME

(71) Applicants: HongQiSheng Precision Electronics (QinHuangDao) Co., Ltd., Qinhuangdao (CN); Avary Holding (Shenzhen) Co., Limited, Shenzhen (CN); GARUDA TECHNOLOGY CO., LTD., New Taipei (TW)

(72) Inventor: Chao Wang, Qinhuangdao (CN)

(73) Assignees: Hong QiSheng Precision Electronics (QinHuang Dao) Co., Ltd., Qinhuangdao (CN); Avary Holding (Shenzhen) Co., Limited., Shenzhen (CN); GARUDA TECHNOLOGY CO., LTD., New Taipei (TW)

( * ) Notice: Subject to any disclaimer, the term of this patent is extended or adjusted under 35 U.S.C. 154(b) by 205 days.

(21) Appl. No.: 18/673,296

(22) Filed: May 23, 2024

(65) Prior Publication Data

US 2025/0142717 A1 May 1, 2025

Related U.S. Application Data

(63) Continuation-in-part of application No. PCT/CN2023/124717, filed on Oct. 26, 2023.

(51) Int. Cl.

| | |
|---|---|
| ***H05K 1/02*** | (2006.01) |
| ***H05K 1/14*** | (2006.01) |
| ***H05K 1/16*** | (2006.01) |
| ***H05K 3/32*** | (2006.01) |
| ***H05K 3/36*** | (2006.01) |
| ***H05K 3/40*** | (2006.01) |

(52) U.S. Cl.
CPC ........... *H05K 1/0277* (2013.01); *H05K 1/144* (2013.01); *H05K 1/165* (2013.01); *H05K 3/32* (2013.01); *H05K 3/36* (2013.01); *H05K 3/4038* (2013.01); *H05K 2201/08* (2013.01)

(58) Field of Classification Search
CPC ............ H05K 1/02; H05K 3/32; H05K 1/144; H05K 1/165; H05K 3/36; H05K 3/4038
USPC .......................................................... 174/250
See application file for complete search history.

(56) References Cited

U.S. PATENT DOCUMENTS

| | | | | |
|---|---|---|---|---|
| 7,692,102 B2 * | 4/2010 | Kawakami | H05K 1/147<br>174/254 |
| 2022/0030703 A1 * | 1/2022 | Li | H05K 1/0216 |
| 2022/0061167 A1 * | 2/2022 | Liu | H05K 1/0298 |

* cited by examiner

*Primary Examiner* — Tremesha W Burns
(74) *Attorney, Agent, or Firm* — ScienBiziP, P.C.

(57) ABSTRACT

A circuit board includes two first circuit substrates, two second circuit substrates, a magnetic assembly, a first component, and a second component. The first circuit substrate includes a first coil. Two second circuit substrates are disposed between the two first circuit substrates and electrically connects the two first circuit substrates. The second circuit substrate includes a second coil. Two grooves are defined on second circuit substrate. The magnetic assembly is disposed between the two first circuit substrates and between the two second circuit substrates. The magnetic assembly includes a magnetic member. The first circuit substrate can be bent by an interaction of a magnetic field generated by the magnetic assembly and a magnetic field generated by the first coil or the second coil. The present disclosure further provides method for manufacturing the circuit board and a terminal device.

20 Claims, 14 Drawing Sheets

CIRCUIT BOARD, METHOD FOR MANUFACTURING THE SAME AND TERMINAL DEVICE HAVING THE SAME

FIELD

The subject matter herein generally relates to circuit boards, and more particularly, to a circuit board, a method for manufacturing the same and a terminal device having the circuit board.

BACKGROUND

Flexible circuit boards are usually provided in bendable terminal devices. Due to flexible circuit boards are difficult to stretch, when assembled in terminal devices, flexible circuit boards require a reserved stretch dimension, which increases a volume of the terminal device and reduces an assembly freedom of the terminal device. Moreover, flexible circuit boards are prone to damage during stretching. Therefore, there is a room for improvement in the art.

BRIEF DESCRIPTION OF THE DRAWINGS

Implementations of the present technology will now be described, by way of example only, with reference to the attached figures.

DETAILED DESCRIPTION

Figure 1:
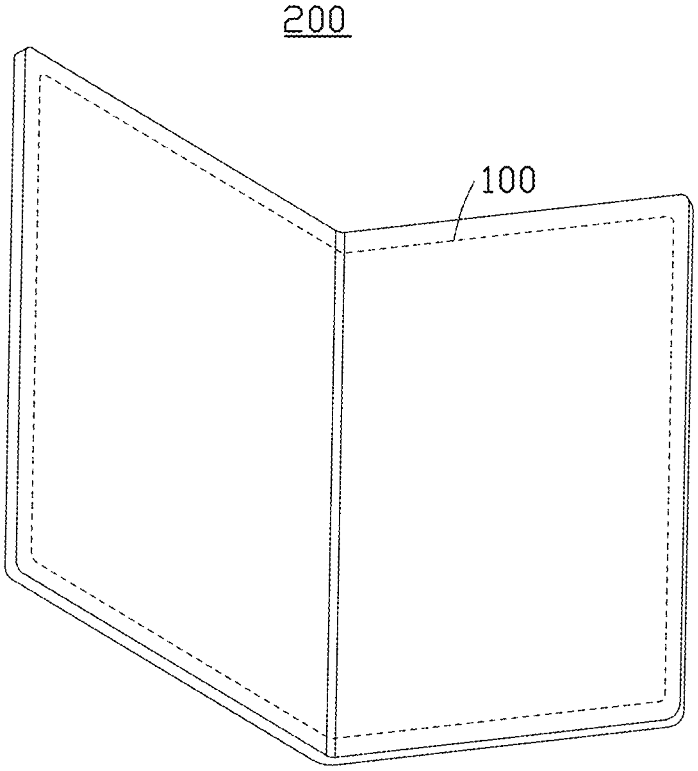
FIG. 1 is a diagrammatic view of an embodiment of a terminal device according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term “comprising,” when utilized, means “including, but not necessarily limited to”; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Referring to FIG. 1, a terminal device 200 is provided according to an embodiment of the present disclosure. The terminal device 200 maybe a dynamically bendable electronic product, such as roll screen phones, folding screen phones, telescopic screen phones, laptops, wearable devices, etc. In the embodiment, the terminal device 200 is a folding screen phone. The terminal device 200 includes a circuit board 100, which can bend and extend or retractable during the bending process, effectively improving an assembly freedom and reliability of the circuit board 100.

Figure 2:
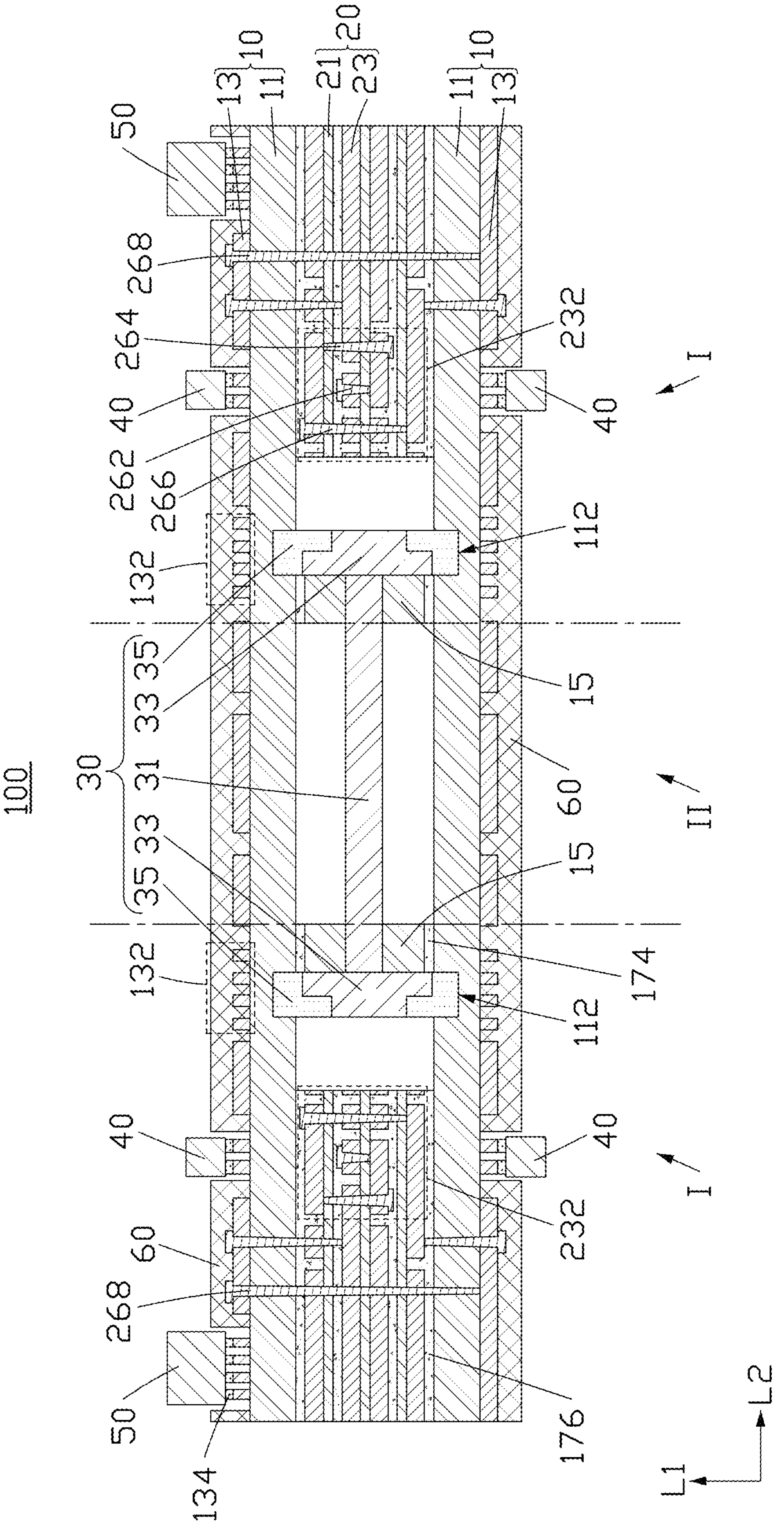
FIG. 2 is a cross-sectional view of an embodiment of a circuit board an elongated state according to the present disclosure.
Figure 3:
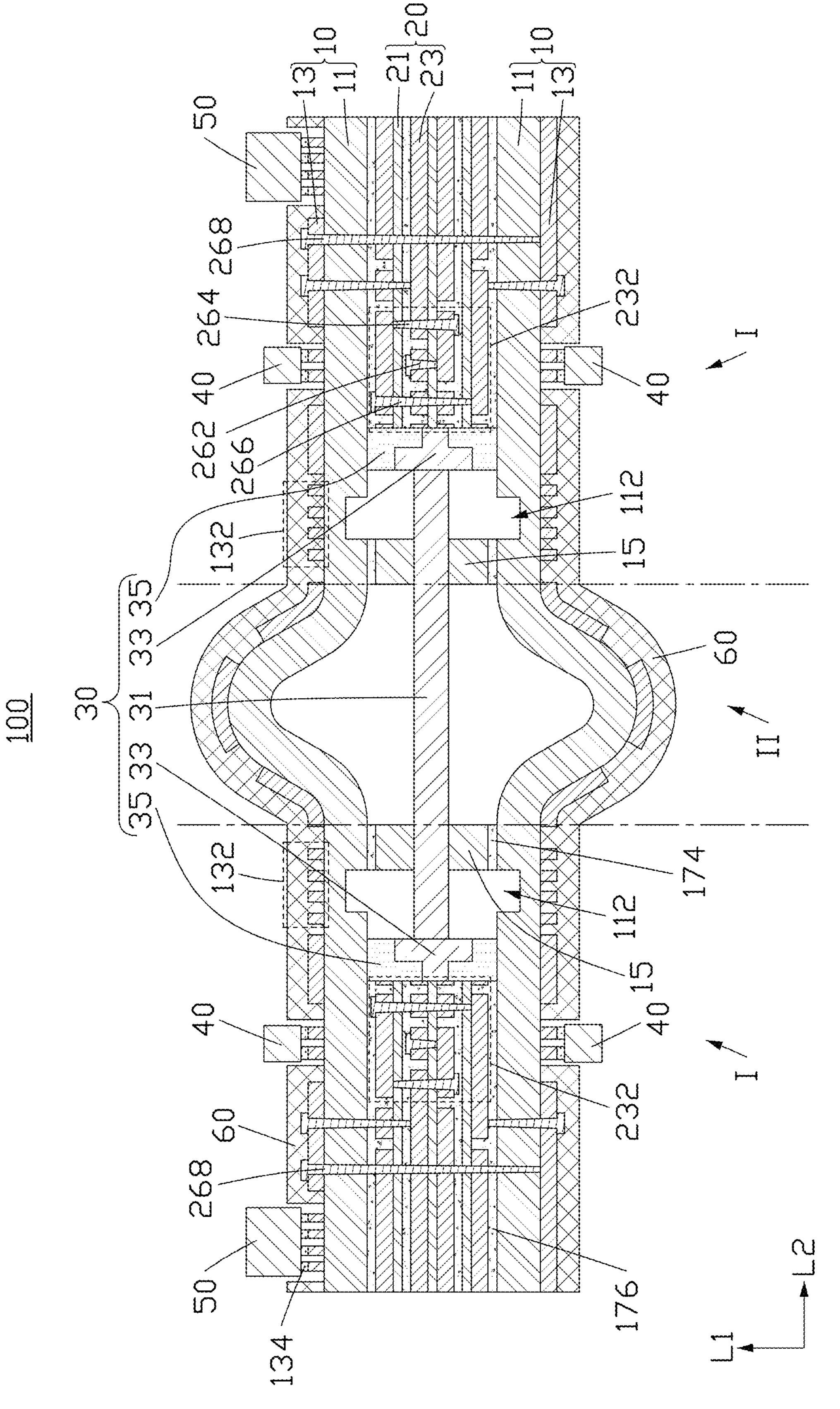
FIG. 3 is a cross-sectional view of an embodiment of a circuit board a contracted state according to the present disclosure.

Referring to FIGS. 2 and 3, the circuit board 100 includes two first circuit substrates 10, two second circuit substrates 20, a magnetic assembly 30, at least one first component 40, and at least one second component 50. The two first circuit substrates 10, the two second circuit substrates 20, the first component 40, and the second component 50 are electrically connected to each other. The two second circuit substrates 20 are disposed between the two first circuit substrates 10 and are spaced apart from each other. The magnetic assembly 30 is disposed between the two first circuit substrates 10 and between the two second circuit substrates 20. The magnetic assembly 30 is spaced apart from the two second circuit substrates 20.

Each first circuit substrate 10 includes a first dielectric layer 11 and a first circuit layer 13 disposed on the first dielectric layer 11. Each of the first dielectric layer 11 and the first circuit layer 13 can have one or more layers. The first circuit substrate 10 is a flexible substrate, that is, the first circuit substrate 10 can be bent. The first dielectric layer 11 can be made of polyimide (short to PI), liquid crystal polymer (short to LCP), or modified polyimide (short to MPI).

Figure 4:
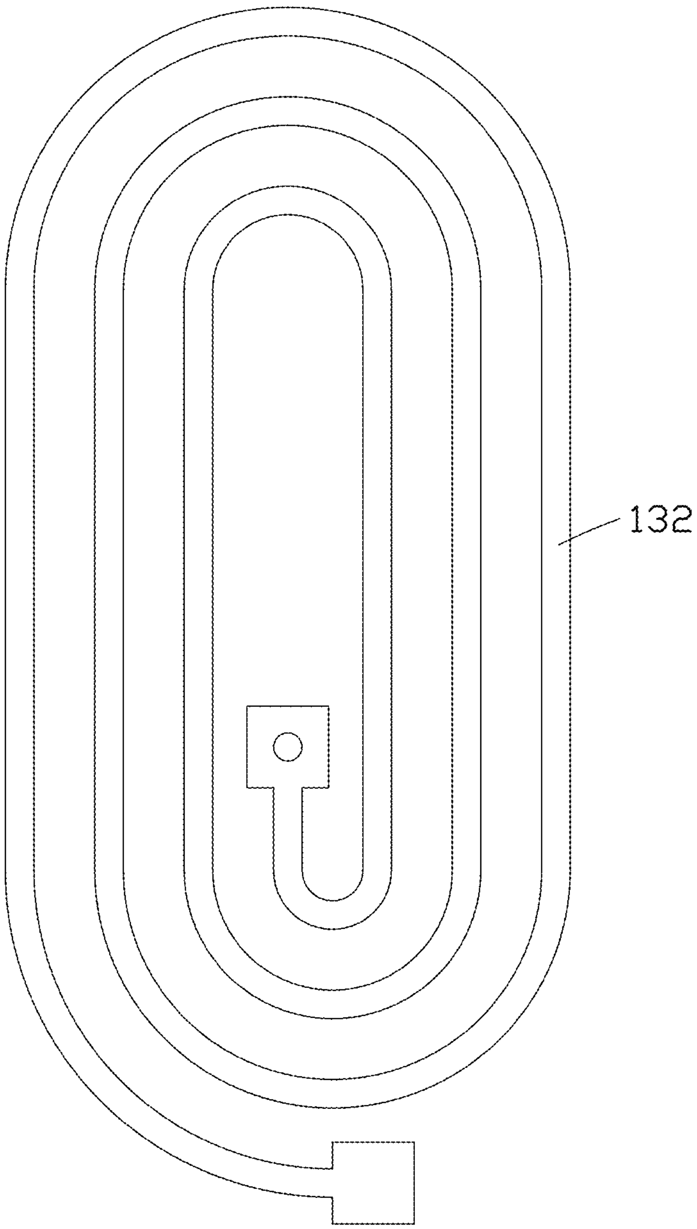
FIG. 4 is a top plan view showing a first coil of the circuit board of FIG. 2.

A direction in which the first circuit layer 13 and the first dielectric layer 11 are stacked is defined as a first direction L1. At least one first coil 132 is formed by a portion of the first circuit layer 13 in a middle area of the first circuit substrate 10. The first coil 132 can surround the first direction L1 as an axis (referring to FIG. 4). Two grooves 112 are formed on a surface of the first dielectric layer 11 facing away from the first circuit layer 13 and connecting to the second circuit substrates 20. The two grooves 112 are spaced apart from each other. The grooves 112 are defined on a surface of the first circuit substrate 10.

Each first circuit substrate 10 is divided into two fixing areas I and a bending area II. The bending area II is disposed between the two fixing areas I. The first coil 132 is disposed in one of the two fixing areas I. Each fixing area I is provided with one of the two grooves 112. The first coil 132 can be disposed corresponding to the groove 112 in the same fixing area I.

Figure 5:
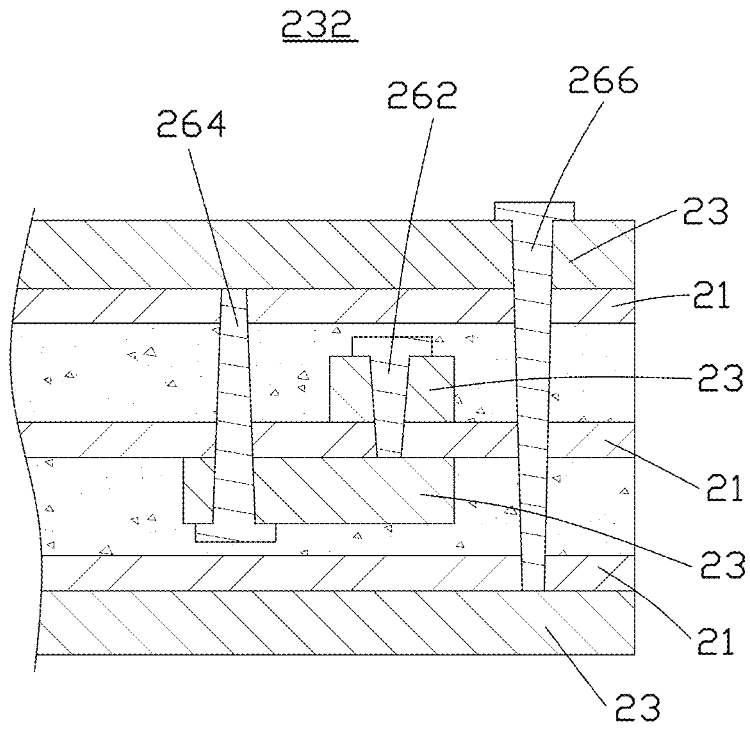
FIG. 5 is a cross-sectional view of a second coil of the circuit board of FIG. 2.

Each second circuit substrate 20 includes a second dielectric layer 21 and a second circuit layer 23 disposed on a surface of the second dielectric layer 21. The second circuit substrate 20 can be a flexible substrate or a rigid substrate. The second circuit layer 23 and the second dielectric layer 21 can have one or more layers. In the embodiment, the second circuit layer 23 and the second dielectric layer 21 may have multiple layers. The multi-layered second circuit layer 23 forms at least one second coil 232 at an end of the second circuit substrate 20. The second coil 232 can surround a second direction L2 perpendicular to the first direction L1 as an axis (referring to FIG. 5). The second coil 232 can be formed by circuit layers of different layers and vias (not shown) between the circuit layers.

The first circuit substrate 10 and the second circuit substrate 20 are electrically connected to each other and surrounded to form a receiving cavity (not labeled). Two opposite surfaces of each second circuit substrate 20 are connected to the first circuit substrate 10 through a second adhesive layer 176. Each second circuit substrate 20 is connected to the fixing area 1, and the groove 112 is exposed from the second circuit substrate 20. A side of the second circuit substrate 20 provided with the second coil 232 faces the receiving cavity, and the magnetic assembly 30 is received in the receiving cavity. When the first circuit substrate 10 is not bent, both ends of the magnetic assembly 30 are spaced apart from the second circuit substrates 20.

The magnetic assembly 30 includes a supporting member 31, at least one elastic member 33, and at least one magnetic member 35. The elastic member 33 is disposed at an end of the supporting member 31. The magnetic member 35 is disposed on the elastic member 33 and protrudes relative to the supporting member 31. The magnetic assembly 30 can be movable relative to the first circuit substrate 10 and the second circuit substrate 20.

In the embodiment, magnetic members 35 are disposed on both sides of each elastic member 33. Each magnetic member 35 can be clamped in the corresponding groove 112. The supporting member 31 can be made of rigid materials such as polyimide, epoxy resin, metal, etc. The elastic member 33 can be a spring, or a rubber, etc. The magnetic member 35 can generate a magnetic field, and the magnetic member 35 can be a magnet or a substance containing magnetic particles such as iron, nickel, ferrite composite, etc.

The first component 40 electrically connects to both the first circuit substrate 10 and the second circuit substrate 20, meaning that the first component 40 connects to either the first circuit substrate 10 or the second circuit substrate 20. In the embodiment, the first component 40 is disposed on a surface of the first circuit substrate 10. The first component 40 can generate a magnetic field repels the magnetic member 35. The magnetic member 35 can presses against and compress the elastic member 33. After the elastic member 33 is compressed, the magnetic member 35 can be released from the groove 112, allowing the magnetic member 35 to release a restriction on the groove 112.

The second component 50 electrically connects to both the first circuit substrate 10 and the second circuit substrate 20, meaning that the second component 50 connects to either the first circuit substrate 10 or the second circuit substrate 20. In the embodiment, the second component 50 is disposed on a surface of the second circuit substrate 20. The second component 50 can generate a magnetic field attracts or repels the magnetic member 35, allowing the magnetic member 35 to attract or repel the second circuit substrate 20.

In other embodiments, winding directions of the first coil 132 and the second coil 232 are not limited.

Referring to FIG. 2, when the circuit board 100 is in an elongated state, that is, the first circuit substrate 10 is in an elongated state, both ends of the magnetic member 35 are respectively clamped in corresponding grooves 112, and both ends of the magnetic assembly 30 are spaced apart from the ends of the second circuit substrate 20.

Referring to FIG. 3, when the circuit board 100 needs to be in a contracted state, the first component 40 controls the first coil 132 to be energized and generating the magnetic field that repels the magnetic member 35. The magnetic member 35 presses against and compress the elastic member 33. When the elastic member 33 is compressed, the magnetic member 35 can be released from the groove 112, allowing the magnetic member 35 to release the restriction on the groove 112. At the same time, the second component 50 controls the second coil 232 to be energized, generating the magnetic field that attracts the magnetic member 35. The magnetic member 35 attracts the second coil 232 and pull the second circuit substrate 20 towards the magnetic member 35, causing the first circuit substrate 10 disposed in the bending zone II to bend. The diagram shown in the FIG. 3 depicts only one possible bending configuration of the first circuit substrate 10 after bending. The first circuit substrate 10 disposed in the bending zone II can also move towards the supporting member 31.

When the circuit board 100 transitions from the contracted state to the elongated state, the second component 50 controls the second coil 232 to be energized, generating the magnetic field that repels the magnetic member 35. The magnetic member 35 pushes away the second coil 232, causing the second circuit substrate 20 to move away from the magnetic member 35 until the magnetic member 35 aligns with the groove 112. After the elastic member 33 rebounds, the magnetic member 35 is clamped in the groove 112, causing a region of the first circuit substrate 10 corresponding to the supporting member 31 being in an elongated state. At the same time, the first coil 132 may be deactivated.

The circuit board 100 provided in the embodiment of the present disclosure allows an outer layer of the first circuit substrate 10 to bend during the bending process, eliminating the possibility of damage to the first circuit substrate 10 due to stretching. When the circuit board 100 is assembled into the terminal device 200, there is no need to reserve space for extending of the circuit board 100, thereby enhancing a freedom of assembly for the circuit board 100.

Each groove 112 can be disposed corresponding to the first coil 132 disposed in the same fixing area I. A projection of each groove 112 on the first dielectric layer 11 is disposed within a projection of the corresponding fixing area I on the first dielectric layer 11, so that the magnetic field generated by the first coil 132 can act on the magnetic piece 35 clamped in the groove 112 at a short distance, which can reduce the current used by the first coil 132 to generate the magnetic field to repel the magnetic piece 35.

The circuit board 100 further includes a plurality of fixing members 15. Each fixing member 15 is fixed to the first circuit substrate 10 facing the supporting member 31. Each first circuit substrate 10 is fixed with at least two fixing members 15. Each fixing member 1 connects the first circuit substrate 10 through a first adhesive layer 174. Each fixing member 15 is disposed in the fixing area I, and the first circuit substrate 10 exposed between two adjacent fixing members 15 is the bending area II. The fixing members 15 can slide relative to the supporting member 31. The fixing members 15 are fixed to the area between the first circuit substrate 10 where two grooves 112 are arranged. In the embodiment, the fixing members 15 are adjacent to the grooves 112. The area between the first circuit substrate 10 to fix the two fixing members 15 can be bent or extended.

Referring to FIGS. 2 and 6 to 14, a method for manufacturing the circuit board 100 is provided according to an embodiment of the present disclosure. The method is provided by way of example, as there are a variety of ways to carry out the method.

Figure 6:
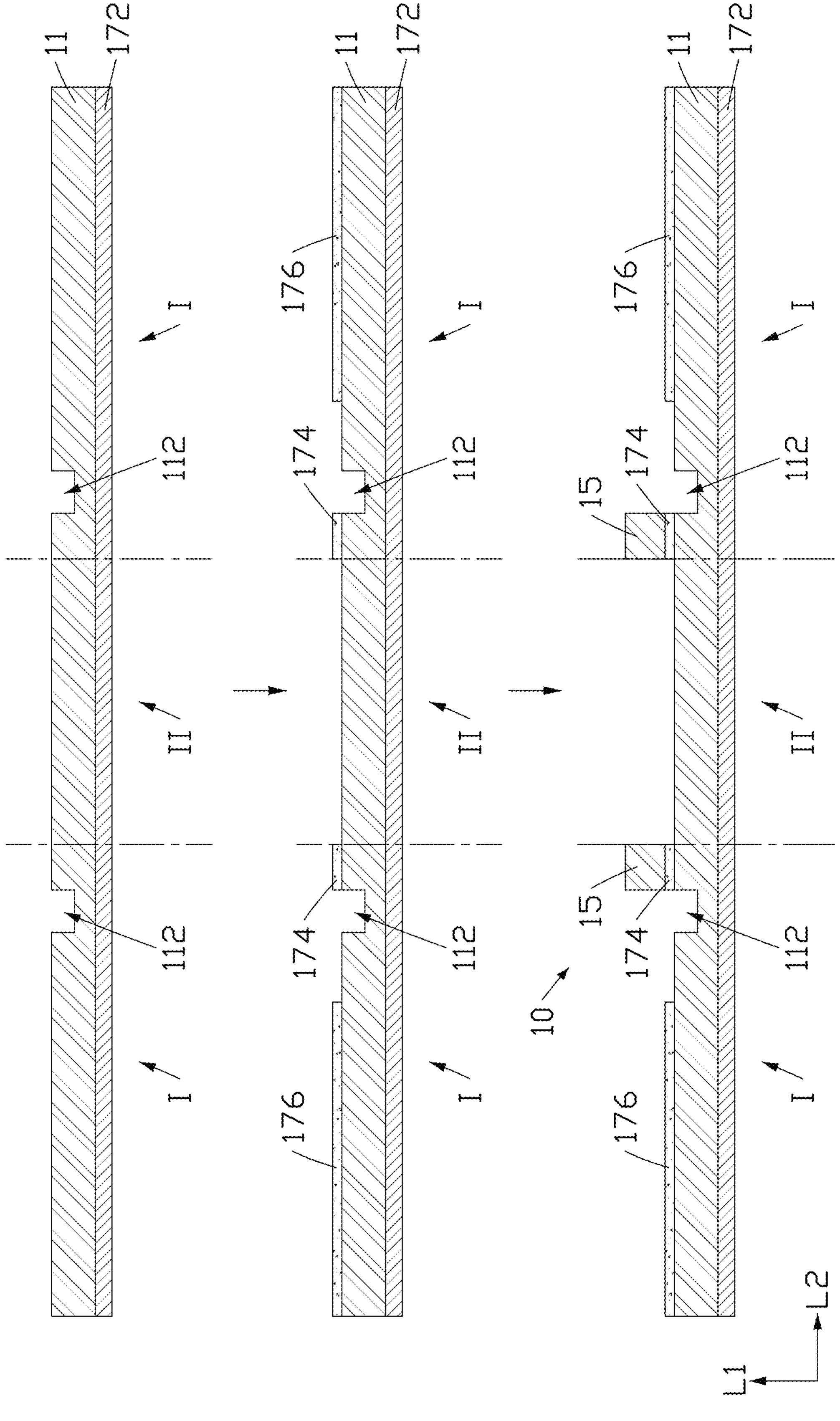
FIG. 6 is a flowchart of an embodiment of a method for manufacturing a first circuit substrate according to the present disclosure.

In block 1, referring to FIG. 6, a first circuit substrate 10 is provided. The first circuit substrate 10 includes a first dielectric layer 11 and a first circuit layer 13 disposed on the first dielectric layer 11. The first circuit layer 13 can form two first coils 132 (referring to FIG. 13) in a middle region of the first circuit substrate 10 during the following manufacturing processes. Two grooves 112 are defined on the first dielectric layer 11 facing away from the first circuit layer 13.

There may be one first dielectric layer 11 or more than one, and there may be one first circuit layer 13 or more than one. In the embodiment, the first circuit substrate 10 includes one first dielectric layer 11 and one first circuit layer 13.

In the embodiment, the first circuit substrate 10 is made of a first substrate 17. The first circuit substrate 10 includes the first dielectric layer 11 and a bottom copper layer 172 disposed on the first dielectric layer 11.

The method for manufacturing the first circuit substrate 10 may include the following blocks.

In block 11, The first substrate 17 is divided into two fixing areas I and one bending area II. The bending area II is disposed between the two fixing areas I. Two grooves 112 are defined on the first dielectric layer 11 facing away from the bottom copper layer 172. Each groove 112 is defined in a corresponding fixing area I.

In block 12, a first adhesive layer 174 and a second adhesive layer 176 are bonded to the first dielectric layer 11 facing away from the bottom copper layer 172. Both the first adhesive layer 174 and the second adhesive layer 176 are disposed in each fixing area I. The first adhesive layer 174 and the second adhesive layer 176 are disposed on both sides of the grooves 112. The first adhesive layer 174 are disposed adjacent to the bending area II. The second adhesive layer 176 are disposed on a side of the groove 112 facing away from the first adhesive layer 174. The first adhesive layer 174 can be spaced apart from or adjacent to the groove 112. The second adhesive layer 176 is spaced apart from the groove 112.

In block 13, a fixing member 15 is bonded to each first adhesive layer 174.

The bottom copper layer 172 will be etched to form the first circuit layer 13 during the following manufacturing processes.

Figure 7:
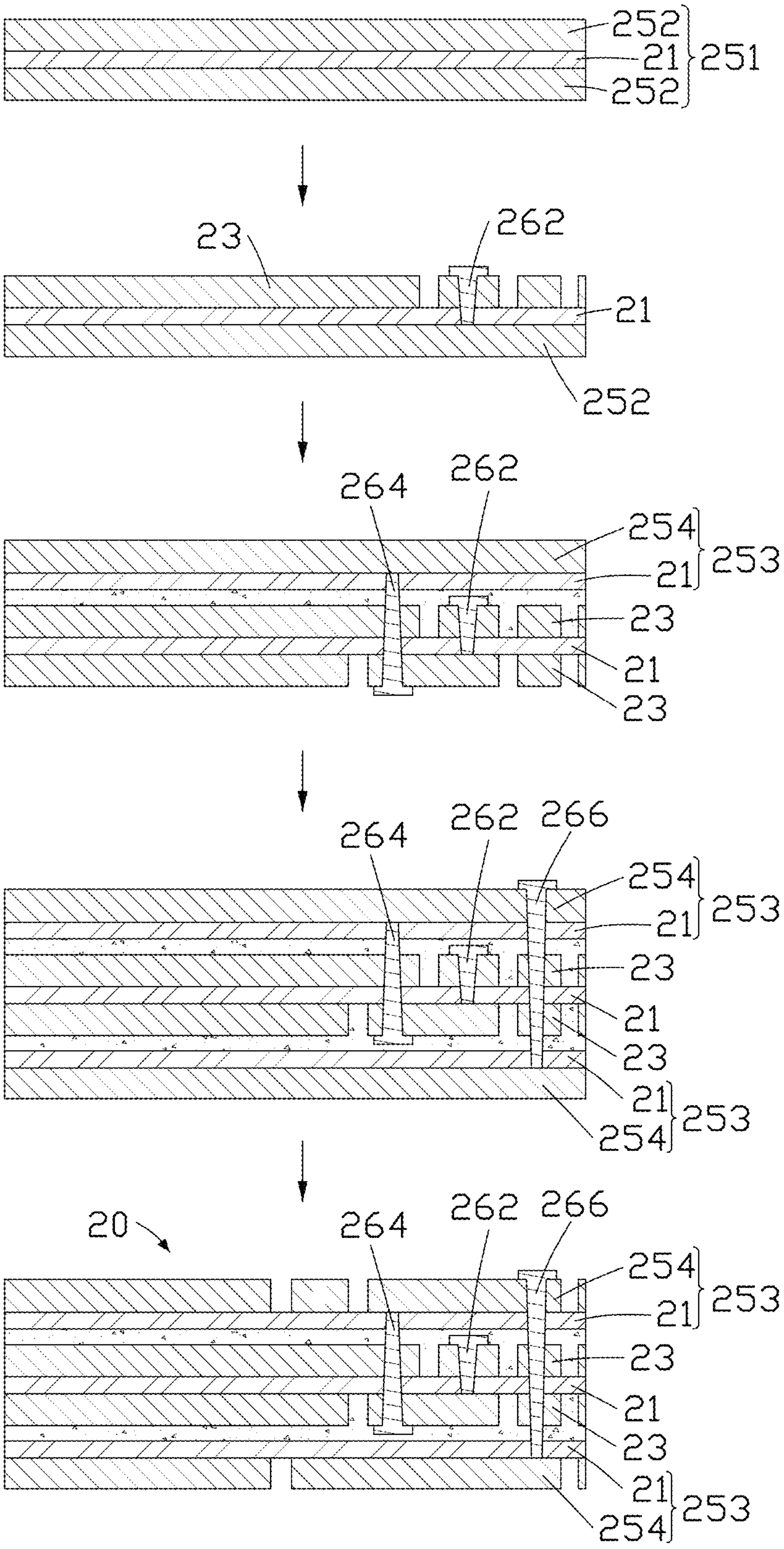
FIG. 7 is a flowchart of an embodiment of a method for manufacturing a second circuit substrate.

Referring to FIG. 7, a second circuit substrate 20 is provided. The second circuit substrate 20 includes a second dielectric layer 21 and a second circuit layer 23 disposed on the second dielectric layer 21. The second circuit layer 23 includes a second coil 232 formed at an end of the second circuit substrate 20.

In the embodiment, the second circuit substrate 20 is described with four second circuit layers 23 as an example. The four second circuit layers 23 stacked together. The method for manufacturing the second circuit substrate 20 may include the following blocks.

In block 21, the second circuit layer 23 is formed by a first copper layer 252 of a double-sided copper-clad laminate 251. A first via 262 is formed to connect the second circuit layer 23 to another first copper layer 252. The double-sided copper-clad laminate 251 further includes the second dielectric layer 21.

In block 22, a single-sided copper-clad laminate 253 is covered on the second circuit layer 23. Another second circuit layer 23 is formed by another first copper layer 252 of the double-sided copper-clad laminate 251, as well as second via 264 is formed to connect the other second circuit layer 23 with a second copper layer 254 of the single-sided copper-clad laminate 253. The single-sided copper-clad laminate 253 further includes the second dielectric layer 21.

In block 23, another single-sided copper-clad laminate 253 is covered on the other second circuit layer 23 facing away from the single-sided copper-clad laminate 253. A third via 266 is formed to connect the second copper layers 254 of the two single-sided copper-clad laminates 253.

In block 24, another second circuit layers 23 are formed by the second copper layers 254 of both single-sided copper-clad laminates 253. The first via 262 is disposed between the second via 264 and the third via 266.

The second circuit layers 23 disposed on different layers and electrically connected to each other to form the second coil 232.

It can be understood that, in other embodiments, as the number of layers of the second circuit layer 23 changes, the manufacturing steps of the second circuit substrate 20 can be modified accordingly.

Figure 8:
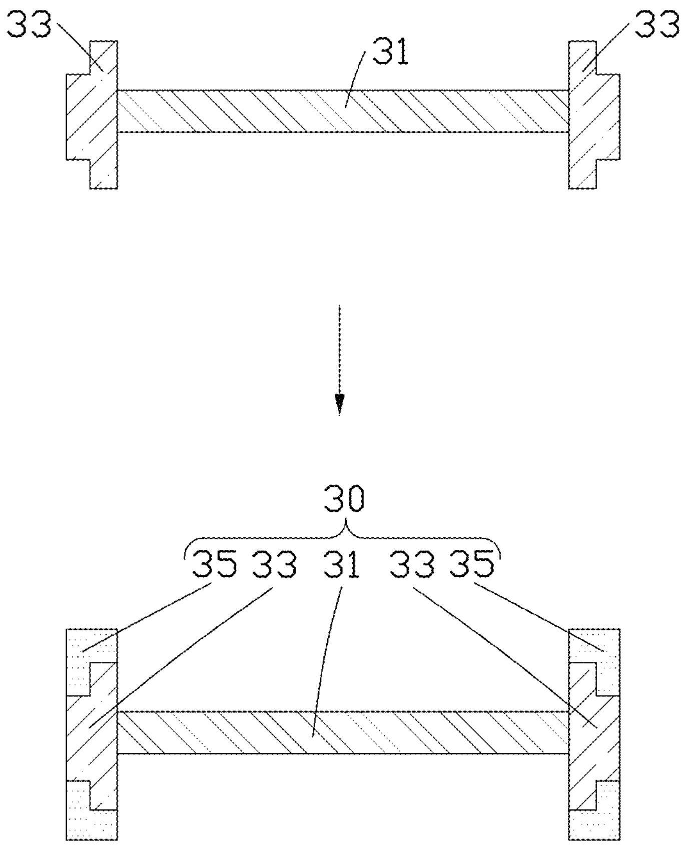
FIG. 8 is a flowchart of an embodiment of a method for manufacturing a magnetic assembly.

Referring to FIG. 8, a magnetic assembly 30 is provided. The magnetic assembly 30 includes a supporting member 31, an elastic member 33, and a magnetic member 35. The elastic member 33 is disposed at an end of the supporting member 31. The magnetic member 35 is disposed on the elastic member 33 and protrudes relative to the supporting member 31.

The elastic member 33 is fixed to an end of the supporting member 31, and the supporting member 31 extends along the second direction L2. The magnetic members 35 are disposed on both sides of each elastic member 33 along the first direction L1. The magnetic members 35 can be pressed against the elastic member 33 along the first direction L1 to deform the elastic member 33.

Figure 9:
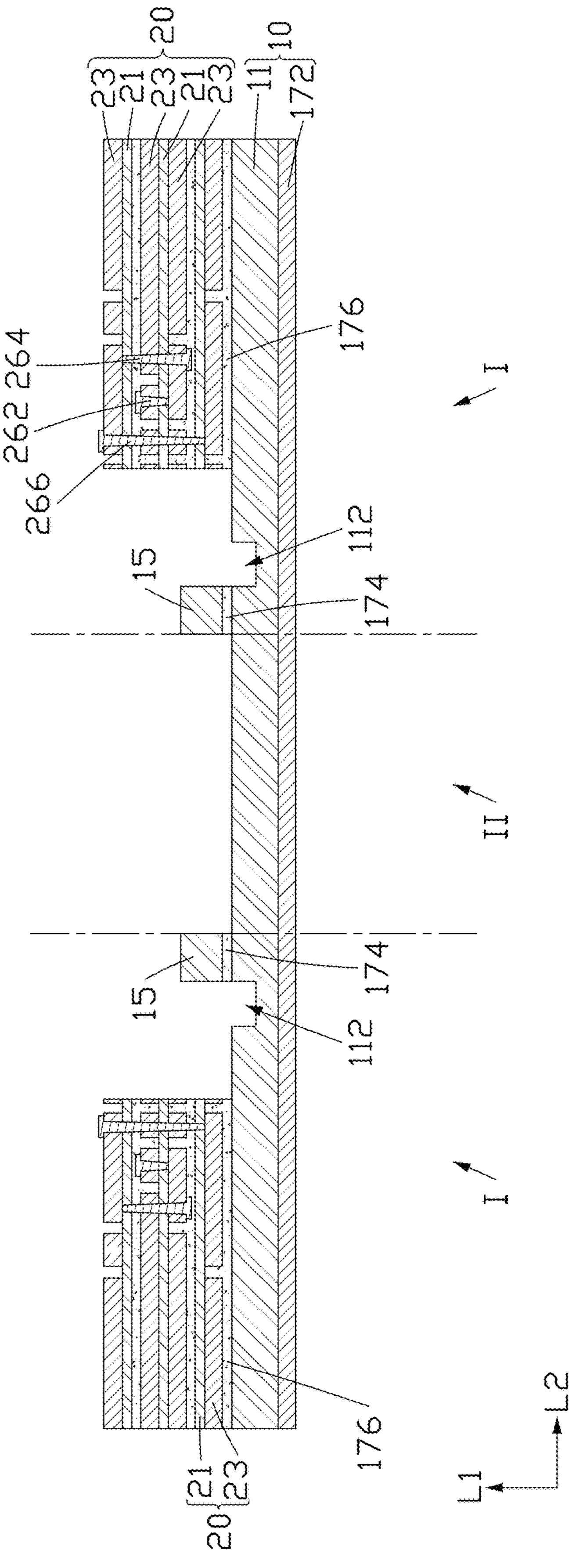
FIG. 9 is a cross-sectional view of two second circuit substrates of FIG. 7 disposed on the first circuit substrates of FIG. 6.

In block 4, referring to FIG. 9, two second circuit substrates 20 are spaced apart from each other and disposed on side of one first circuit substrates 10 where the groove 112 is defined.

The second circuit substrates 20 are bonded to the corresponding second adhesive layer 176. Each second circuit substrate 20 is spaced apart from the groove 112 on the corresponding side.

Figure 10:
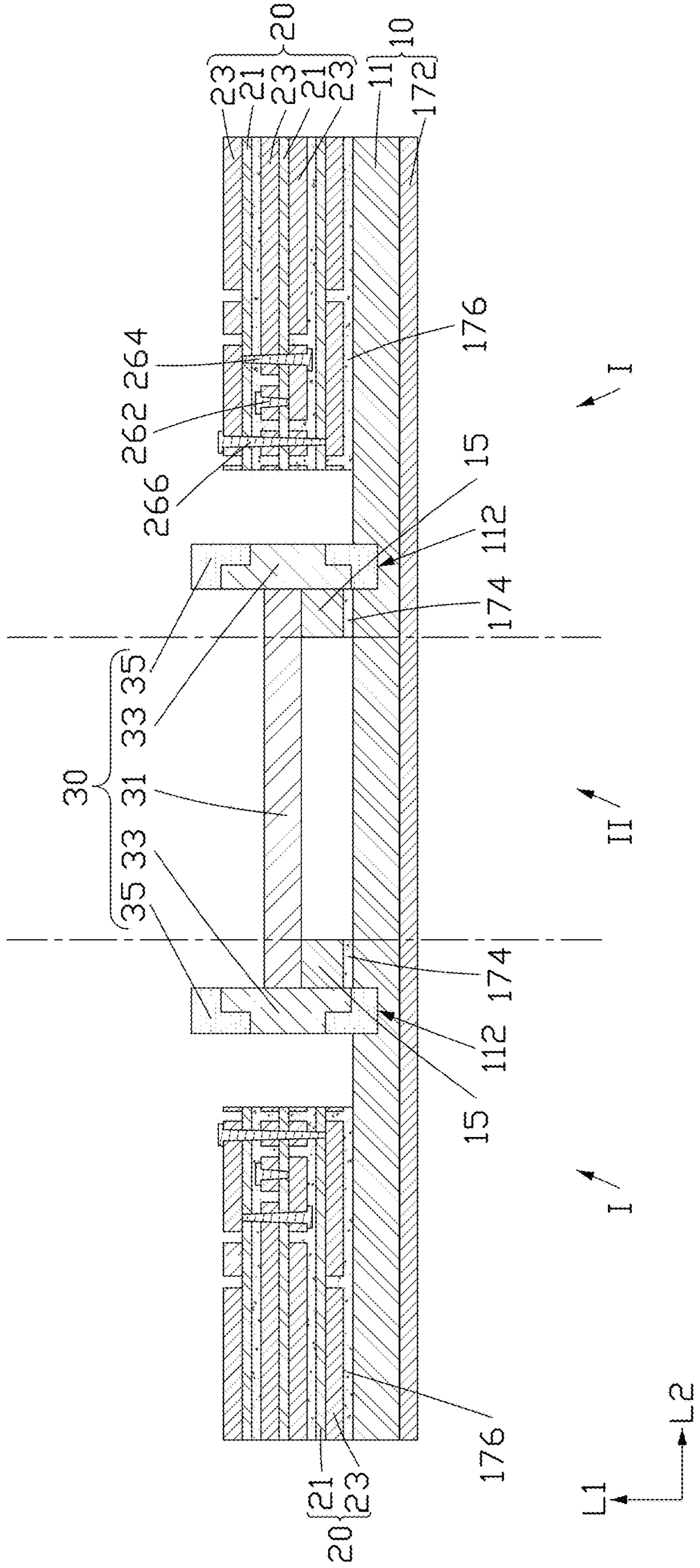
FIG. 10 is a cross-sectional view of the magnetic assembly of FIG. 8 disposed between the two second circuit substrates of FIG. 9.

In block 5, referring to FIG. 10, the magnetic assembly 30 is disposed on the first circuit substrate 10 and disposed between the two second circuit substrates 20. The magnetic member 35 is clamped in the groove 112 and spaced apart from the second circuit substrates 20. The sides of the magnetic member 35 and the elastic member 33 facing away from the supporting member 31 are spaced apart from the second circuit substrates 20. A distance between the second circuit substrate 20 and the magnetic assembly 30 represents a space for the second circuit substrate 20 to move relative to the magnetic assembly 30.

The fixing members 15 facing away from the first dielectric layer 11 is connected to the supporting member 31, and the elastic member 33 adjacent to the supporting member 31 is connected to the fixing members 15. The fixing members 15 can slide relative to the supporting member 31 along the second direction L2.

Figure 11:
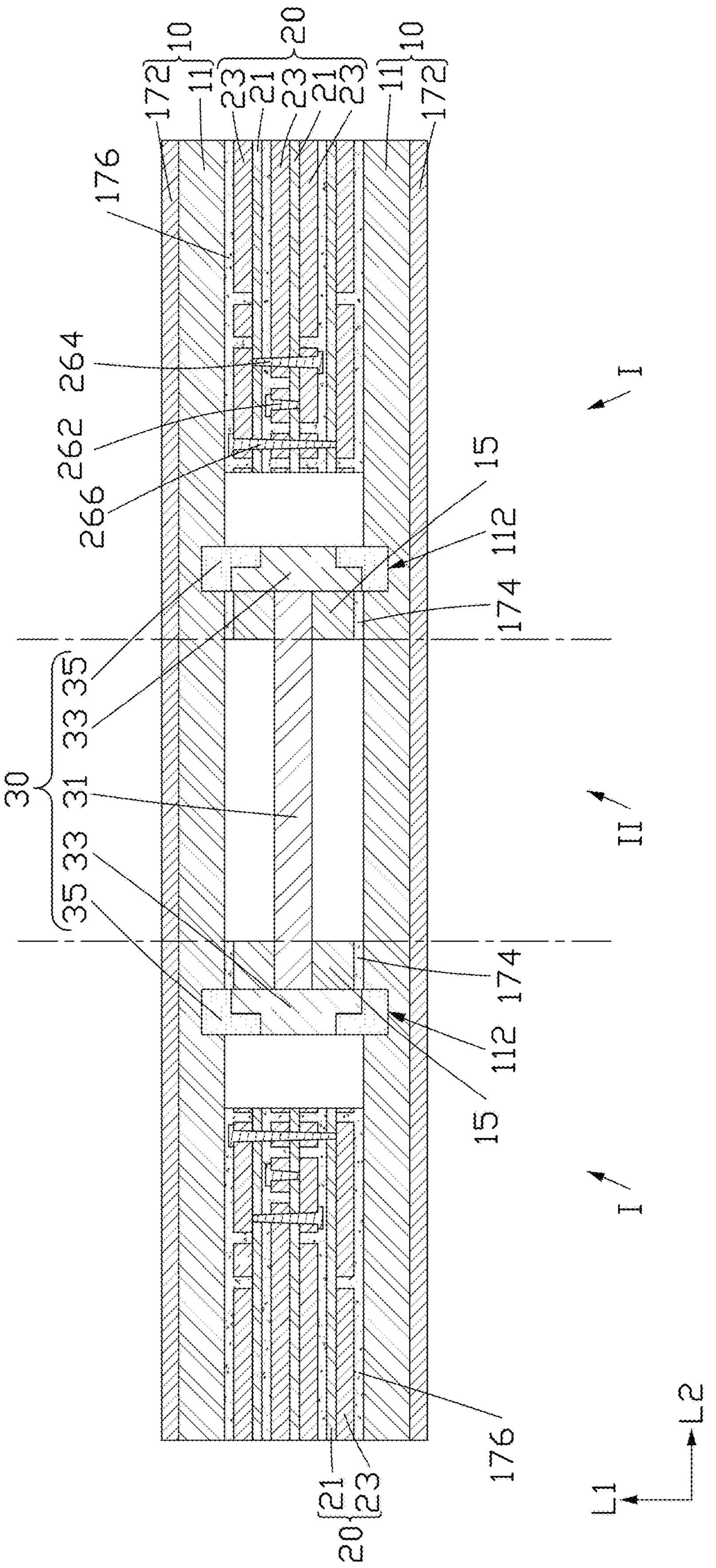
FIG. 11 is a cross-sectional view of another first circuit substrates of FIG. 6 disposed on the two second circuit substrates and the magnetic assembly of FIG. 10.

In block 6, referring to FIG. 11, another first circuit substrate 10 is covered on the second circuit substrate 20 and the magnetic assembly 30.

In the embodiment, two first circuit substrates 10 are symmetrically disposed on either side of the second circuit substrate 20. The magnetic member 35 is clamped in the groove 112 of the other first circuit substrate 10, and the second circuit substrate 20 is connected to the second adhesive layer 176 of the other first circuit substrate 10.

Figure 12:
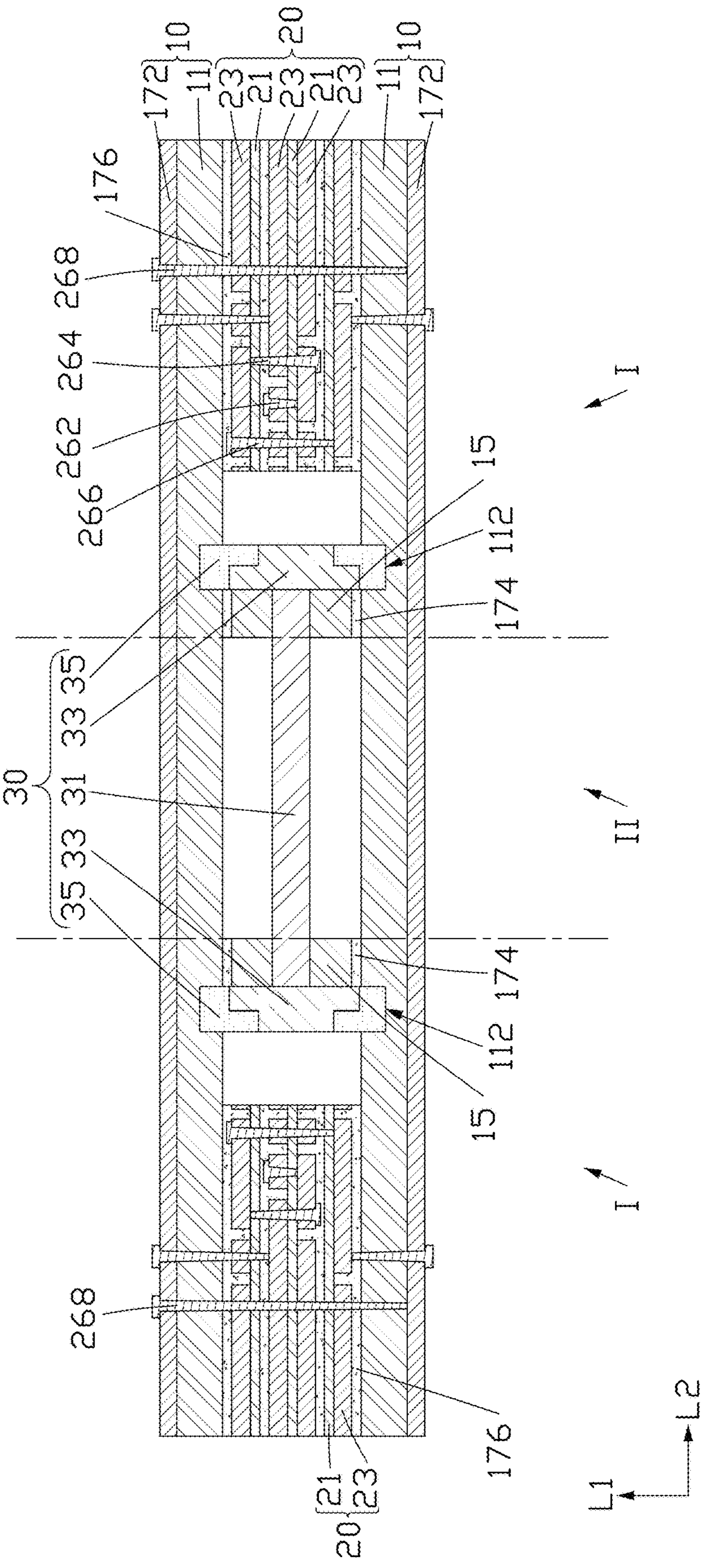
FIG. 12 is a cross-sectional view of a fourth via formed to electrically connect the first circuit substrate and the second circuit substrate of FIG. 11.

In block 7, referring to FIG. 12, a fourth via 268 is formed to electrically connect the first circuit substrate 10 and the second circuit substrate 20.

Figure 13:
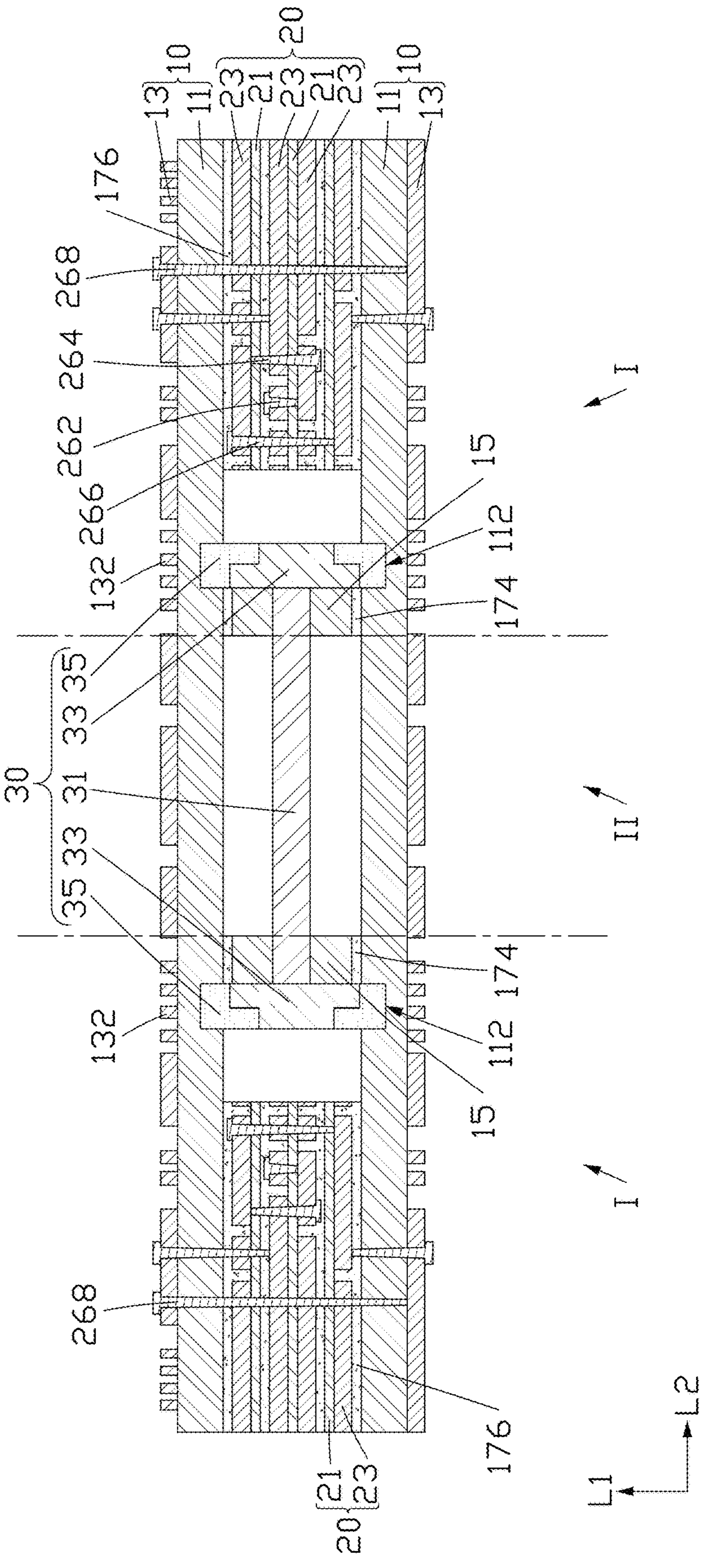
FIG. 13 is a cross-sectional view of a bottom copper layer etched of the first circuit substrate of FIG. 12.

In block 8, referring to FIG. 13, the first circuit layer 13 is formed by the bottom copper layer 172 etched. In other embodiments, the bottom copper layer 172 can be circuit fabrication performed before the block of connecting the second circuit substrate 20 and the first circuit substrate 10.

In the block of forming the first circuit layer 13, the first coil 132 disposed in the fixing area I and the bending area II is formed by the bottom copper layer 172.

Figure 14:
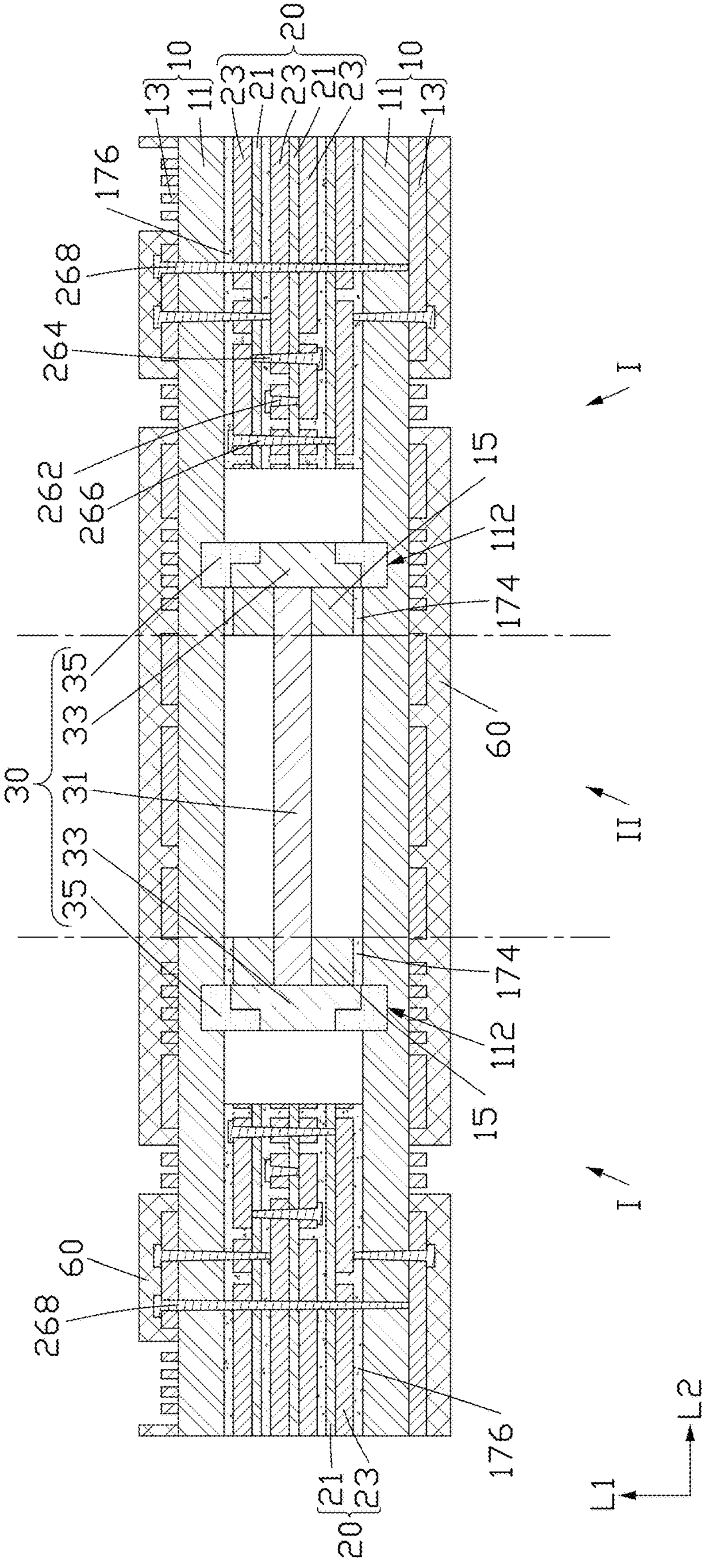
FIG. 14 is a cross-sectional view of a solder mask layer disposed on the first circuit substrate of FIG. 13.

In block 9, referring to FIG. 14, a solder mask layer 60 is formed on the first circuit substrate 10.

The solder mask layer 60 covers a portion of the first circuit layer 13 and the first dielectric layer 11 exposed from the first circuit layer 13, and a portion of the first circuit layer 13 is exposed from the solder mask layer 60.

In some embodiments, the method further includes a block of forming a gold layer 134 on the first circuit layer 13 exposed from the solder mask layer 60.

In block 9, referring to FIG. 2, a first component 40 and a second component 50 are electrically connect to the first circuit substrate 10 to obtain the circuit board 100. The first component 40 can cause the first coil 132 to generate a magnetic field that repels the magnetic member 35 to compress the elastic member 33, so that the magnetic member 35 releases the restriction of the groove 112. The second component 50 can cause the second coil 232 to generate the attracting or repelling magnetic field as the magnetic member 35, so that the magnetic member 35 attracts or repels the second circuit substrate 20 to compress or extend the first circuit substrate 10.

The first component 40 and the second component 50 are connected on the first circuit layer 13 exposed from the solder mask layer 60. In other embodiments, the first component 40 or the second component 50 can further be connected to the second circuit substrate 20, for example, embedded between the first circuit substrate 10 and the second circuit substrate 20.

In the embodiment, each first coil 132 electrically connects to one first component 40, and each second coil 232 electrically connects to one second component 50.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board, comprising:

two first circuit substrates, each of the two first circuit substrates comprising a first dielectric layer and a first circuit layer disposed on the first dielectric layer, the first circuit layer comprising at least one first coil;

two second circuit substrates disposed between the two first circuit substrates and electrically connecting the two first circuit substrates, the two second circuit substrates spaced apart from each other, each of the two second circuit substrates comprising a second dielectric layer and a second circuit layer disposed on the second dielectric layer, the second circuit layer comprising at least one second coil, and two grooves defined on a surface of the first dielectric layer facing away from the first circuit layer and connecting to the two second circuit substrates;

a magnetic assembly disposed between the two first circuit substrates and between the two second circuit substrates, when the two first circuit substrates are not bent, the magnetic assembly is spaced apart from the two second circuit substrates, the magnetic assembly comprising a supporting member, at least one elastic member, and at least one magnetic member, the at least one magnetic member disposed on the at least one elastic member and protruding relative to the supporting member, one of the at least one magnetic members configured to be clamped in one of the two grooves;

at least one first component electrically connecting to the two first circuit substrates, the at least one first component configured to control the at least one first coil to generate a magnetic field repelling the at least one magnetic member to compress the at least one elastic member; and at least one second component electrically connecting to the two first circuit substrates, the at least one second component configured to control the at least one second coil to generate a magnetic field attracting or repelling the at least one magnetic member, allowing the at least one magnetic member to attract or repel the two second circuit substrates.

2. The circuit board of claim 1, comprising a plurality of fixing members, wherein each of the plurality of fixing members is disposed on a side of one of the first circuit substrates facing the supporting member, two adjacent fixing members of the plurality of fixing members are spaced apart from each other, each of the plurality of fixing members is configured to slide relative to the supporting member.

3. The circuit board of claim 2, further comprising a first adhesive layer, wherein the first adhesive layer bonds each of the plurality of fixing members to one of the two first circuit substrates.

4. The circuit board of claim 1, wherein the at least one first coil surrounds a first direction as an axis, the at least one second coil surrounds a second direction as an axis, the second direction is perpendicular to the first direction.

5. The circuit board of claim 1, wherein both sides of the at least one elastic member are provided with the at least one magnetic member, the at least one magnetic member is configured to compress the at least one elastic member under the magnetic field generated by the at least one first coil.

6. The circuit board of claim 1, wherein each of the two first circuit substrates is divided into two fixing areas and a bending area, the bending area is disposed between the two fixing areas, each of the two fixing areas is provided with one of the two grooves, the at least one first coil is disposed in one of the two fixing areas, a projection of each of the two grooves on the first dielectric layer is disposed within a projection of the corresponding fixing area of the two fixing areas on the first dielectric layer.

7. The circuit board of claim 1, wherein each of the two second circuit substrates comprises four second circuit layers stacked together, a first via, a second via, and a third via, the first via electrically connects two inner second circuit layers of the four second circuit layers, the third via electrically connects two outer second circuit layers of the four second circuit layers, the second via electrically connects one inner second circuit layer of the four second circuit layers to one outer second circuit layer of the four second circuit layers, the first via is disposed between the second via and the third via.

8. The circuit board of claim 1, further comprising a second adhesive layer, wherein the second adhesive layer bonds the two first circuit substrates to the two second circuit substrates.

9. A method for manufacturing a circuit board comprising:

providing a first circuit substrate, the first circuit substrate comprising a first dielectric layer and a first circuit layer disposed on the first dielectric layer, the first circuit layer comprising at least one first coil, two grooves defined on the first dielectric layer facing away from the first circuit layer;

providing a second circuit substrate, the second circuit substrate comprising a second dielectric layer and a second circuit layer disposed on the second dielectric layer, the second circuit layer comprising at least one second coil;

disposing two second circuit substrates spaced apart from each other on the first circuit substrate where the two grooves are defined;

disposing a magnetic assembly on the first circuit substrate and between the two second circuit substrates, the magnetic assembly comprising a supporting member, at least one elastic member, and at least one magnetic member, the at least one elastic member disposed on both sides of the supporting member, the at least one magnetic member disposed on the at least one elastic member and protruding relative to the supporting member, each of the at least one magnetic member configured to be clamped in each of the two grooves and spaced apart from the two second circuit substrates;

covering another first circuit substrate on the two second circuit substrates and the magnetic assembly, electrically connecting the first circuit substrate and the two second circuit substrates; and electrically connecting at least one first component and at least one second component on the first circuit substrate, the at least one first component configured to generate a magnetic field repelling the at least one magnetic member to compress the at least one elastic member, the at least one second component configured to generate a magnetic field attracting or repelling the at least one magnetic member, allowing the at least one magnetic member to attract or repel the two second circuit substrates.

10. The method for manufacturing the circuit board of claim 9, wherein a method for manufacturing the first circuit substrate comprises:

providing a first substrate, the first substrate comprising the first dielectric layer and a bottom copper layer disposed on the first dielectric layer, the first substrate divided into two fixing areas and a bending area, the bending area disposed between the two fixing areas;

defining the two grooves on the first dielectric layer facing away from the bottom copper layer, one of the two grooves corresponding to one of the two fixing areas; and etching the bottom copper layer to form the first circuit layer.

11. The method for manufacturing the circuit board of claim 10, further comprising:

bonding a first adhesive layer and a second adhesive layer to the first dielectric layer facing away from the bottom copper layer, the first adhesive layer and the second adhesive layer disposed on each of the two fixing areas, the first adhesive layer and the second adhesive layer disposed on two sides of the two grooves, the first adhesive layer disposed adjacent to the bending area, the second adhesive layer disposed on a side of the two grooves facing away from the first adhesive layer; and bonding a fixing member to the first adhesive layer, and bonding the second circuit substrate to the second adhesive layer.

12. The method for manufacturing the circuit board of claim 9, wherein the second circuit substrate comprises a plurality of second circuit layers, a method for manufacturing the first circuit substrate comprises:

etching one first copper layer of a double-sided copper-clad laminate to form one of the plurality of second circuit layers, forming a first via to connect the one of the plurality of second circuit layers to another first copper layer of the double-sided copper-clad laminate;

covering a single-sided copper-clad laminate on the one of the plurality of second circuit layers, etching another first copper layer to form the one of the plurality of second circuit layers, forming a second via to connect the one of the plurality of second circuit layers to a second copper layer of the single-sided copper-clad laminate;

covering another single-sided copper-clad laminate on the one of the plurality of second circuit layers facing away from the single-sided copper-clad laminate, forming a third via to connect two second copper layers of two single-sided copper-clad laminate; and etching the two second copper layers to form two of the plurality of second circuit layers, the first via disposed between the second via and the third via.

13. A terminal device comprising a circuit board, comprising:

two first circuit substrates, each of the two first circuit substrates comprising a first dielectric layer and a first circuit layer disposed on the first dielectric layer, the first circuit layer comprising at least one first coil;

two second circuit substrates disposed between the two first circuit substrates and electrically connecting the two first circuit substrates, the two second circuit substrates spaced apart from each other, each of the two second circuit substrates comprising a second dielectric layer and a second circuit layer disposed on the second dielectric layer, the second circuit layer comprising at least one second coil, and two grooves are defined on a surface of the first dielectric layer facing away from the first circuit layer and connect to the two second circuit substrates;

a magnetic assembly disposed between the two first circuit substrates and between the two second circuit substrates, when the two first circuit substrates are not bent, the magnetic assembly is spaced apart from the two second circuit substrates, the magnetic assembly comprising a supporting member, at least one elastic member, and at least one magnetic member, the at least one magnetic member disposed on the at least one elastic member and protruding relative to the supporting member, one of the at least one magnetic members configured to be clamped in one of the two grooves;

at least one first component electrically connecting to the two first circuit substrates, the at least one first component configured to control the at least one first coil to generate a magnetic field repelling the at least one magnetic member to compress the at least one elastic member; and at least one second component electrically connecting to the two first circuit substrates, the at least one second component configured to control the at least one second coil to generate a magnetic field attracting or repelling the at least one magnetic member, allowing the at least one magnetic member to attract or repel the two second circuit substrates.

14. The terminal device of claim 13, comprising a plurality of fixing members, wherein each of the plurality of fixing members is disposed on a side of one of the first circuit substrates facing the supporting member, two adjacent fixing members of the plurality of fixing members are spaced apart from each other, each of the plurality of fixing members is configured to slide relative to the supporting member.

15. The terminal device of claim 14, further comprising a first adhesive layer, wherein the first adhesive layer bonds each of the plurality of fixing members to one of the two first circuit substrates.

16. The terminal device of claim 13, wherein the at least one first coil surrounds a first direction as an axis, the at least one second coil surrounds a second direction as an axis, the second direction is perpendicular to the first direction.

17. The terminal device of claim 13, wherein both sides of the at least one elastic member are provided with the at least one magnetic member, the at least one magnetic member is configured to compress the at least one elastic member under the magnetic field generated by the at least one first coil.

18. The terminal device of claim 13, wherein each of the two first circuit substrates is divided into two fixing areas and a bending area, the bending area is disposed between the two fixing areas, each of the two fixing areas is provided with one of the two grooves, the at least one first coil is disposed in one of the two fixing areas, a projection of each of the two grooves on the first dielectric layer is disposed within a projection of the corresponding fixing area of the two fixing areas on the first dielectric layer.

19. The terminal device of claim 13, wherein each of the two second circuit substrates comprises four second circuit layers stacked together, a first via, a second via, and a third via, the first via electrically connects two inner second circuit layers of the four second circuit layers, the third via electrically connects two outer second circuit layers of the four second circuit layers, the second via electrically connects one inner second circuit layer of the four second circuit layers to one outer second circuit layer of the four second circuit layers, the first via is disposed between the second via and the third via.

20. The terminal device of claim 13, further comprising a second adhesive layer, wherein the second adhesive layer bonds the two first circuit substrates to the two second circuit substrates.

* * * * *